United States Patent
Huang et al.

(10) Patent No.: US 12,133,356 B2
(45) Date of Patent: Oct. 29, 2024

(54) SYSTEM AND METHOD FOR MANAGING RETAINING COOLING COMPONENTS IN DATA PROCESSING SYSTEMS

(71) Applicant: Dell Products L.P., Round Rock, TX (US)

(72) Inventors: Chin-An Huang, Taipei (TW); Ju-Hao Lee, Taipei (TW); Michael Albert Perks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 229 days.

(21) Appl. No.: 18/048,149

(22) Filed: Oct. 20, 2022

(65) Prior Publication Data
US 2024/0138102 A1  Apr. 25, 2024
US 2024/0237274 A9  Jul. 11, 2024

(51) Int. Cl.
*H05K 7/20* (2006.01)
*G06F 1/20* (2006.01)

(52) U.S. Cl.
CPC ........... *H05K 7/20172* (2013.01); *G06F 1/20* (2013.01)

(58) Field of Classification Search
CPC .............................. H05K 7/20172; G06F 1/20
See application file for complete search history.

(56) References Cited

U.S. PATENT DOCUMENTS

| | | | |
|---|---|---|---|
| 5,050,667 A * | 9/1991 | Berner | F24F 12/001 165/4 |
| 5,602,721 A | 2/1997 | Slade et al. | |
| 5,761,033 A | 6/1998 | Wilhelm | |
| 7,048,498 B2 * | 5/2006 | Kosugi | F04D 29/663 415/214.1 |
| 7,698,095 B2 | 4/2010 | Chung et al. | |
| 7,699,692 B2 * | 4/2010 | Yin | H05K 7/20727 361/679.48 |
| 7,701,713 B2 * | 4/2010 | Li | F04D 25/166 361/679.48 |
| 8,068,340 B1 * | 11/2011 | Nguyen | H05K 7/20172 174/547 |
| 8,182,319 B2 | 5/2012 | Ong et al. | |
| 8,320,120 B1 * | 11/2012 | Chan | H05K 7/20727 165/122 |
| 8,550,702 B2 | 10/2013 | Campbell et al. | |
| 8,873,236 B1 * | 10/2014 | Tamarkin | F04D 29/601 361/679.48 |
| 9,055,693 B2 * | 6/2015 | Arreola | H05K 7/20172 |
| 9,129,958 B2 | 9/2015 | Mallik et al. | |
| 9,173,323 B2 * | 10/2015 | Liao | H05K 7/20727 |

(Continued)

*Primary Examiner* — Stephen S Sul
(74) *Attorney, Agent, or Firm* — Womble Bond Dickinson (US) LLP

(57) ABSTRACT

Methods and systems for managing the operation of data processing systems are disclosed. A data processing system may include a computing device that may provide computer implemented services. To provide the computer implemented services, hardware components of the data processing system may need to operate in predetermined manners. To manage the operation of the hardware components, the data processing system may cool the hardware components to dissipate heat from the hardware components. The data processing system may include a fan retention mechanism that facilitates orientation of positioning of cooling components used to dissipate the heat from the hardware components.

20 Claims, 11 Drawing Sheets

(56) References Cited

U.S. PATENT DOCUMENTS

| | | | |
|---|---|---|---|
| 9,173,326 B1* | 10/2015 | Smith | H05K 7/20727 |
| 9,237,671 B2 | 1/2016 | Chen et al. | |
| 9,433,124 B2* | 8/2016 | Wilcox | F04D 29/563 |
| 9,769,958 B2* | 9/2017 | Jaskela | H05K 7/20718 |
| 9,820,411 B2 | 11/2017 | Alshinnawi et al. | |
| 9,999,161 B2* | 6/2018 | Mease | H05K 7/20727 |
| 10,123,452 B2 | 11/2018 | Chen et al. | |
| 10,177,107 B2 | 1/2019 | Camarota | |
| 10,274,945 B2 | 4/2019 | Arensmeier et al. | |
| 10,709,032 B1 | 7/2020 | Holyoake et al. | |
| 11,019,748 B2* | 5/2021 | Avvaru | H05K 7/1489 |
| 11,064,808 B2 | 7/2021 | Chen et al. | |
| 11,129,293 B2 | 9/2021 | Wurmfeld | |
| 11,262,809 B2 | 3/2022 | Pham et al. | |
| 11,293,659 B2 | 4/2022 | Brahme et al. | |
| 11,320,164 B2 | 5/2022 | Roth | |
| 11,716,833 B1* | 8/2023 | Lin | H05K 7/20172 361/695 |
| 2001/0040203 A1 | 11/2001 | Brock et al. | |
| 2005/0249603 A1* | 11/2005 | Kang | F04D 29/601 416/244 R |
| 2006/0279929 A1* | 12/2006 | Chen | G06F 1/20 361/697 |
| 2007/0076368 A1* | 4/2007 | Pike | G06F 1/20 361/679.48 |
| 2011/0100668 A1 | 5/2011 | Syed | |
| 2011/0228473 A1 | 9/2011 | Anderson et al. | |
| 2012/0229971 A1 | 9/2012 | Mills et al. | |
| 2014/0334084 A1 | 11/2014 | Fricker | |
| 2015/0177750 A1 | 6/2015 | Bailey et al. | |
| 2015/0180234 A1 | 6/2015 | Bailey et al. | |
| 2015/0289405 A1 | 10/2015 | Stewart et al. | |
| 2015/0359146 A1 | 12/2015 | Bailey et al. | |
| 2016/0044819 A1 | 2/2016 | Bailey et al. | |
| 2016/0174409 A1* | 6/2016 | Mease | H05K 7/20172 361/695 |
| 2017/0177007 A1 | 6/2017 | Shelnutt et al. | |
| 2017/0181329 A1 | 6/2017 | Shelnutt et al. | |
| 2018/0011522 A1 | 1/2018 | Shirakami et al. | |
| 2020/0221603 A1* | 7/2020 | Shabbir | H05K 7/20727 |
| 2021/0235600 A1* | 7/2021 | Lambert | H05K 7/20727 |
| 2022/0104380 A1 | 3/2022 | Hattangadi et al. | |
| 2022/0200250 A1 | 6/2022 | Brooks et al. | |
| 2024/0102491 A1* | 3/2024 | Chen | F04D 25/0693 |

* cited by examiner

SYSTEM AND METHOD FOR MANAGING RETAINING COOLING COMPONENTS IN DATA PROCESSING SYSTEMS

FIELD OF THE EMBODIMENTS

Embodiments disclosed herein relate generally to thermal management of devices. More particularly, embodiments disclosed herein relate to systems and methods for securing cooling devices.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
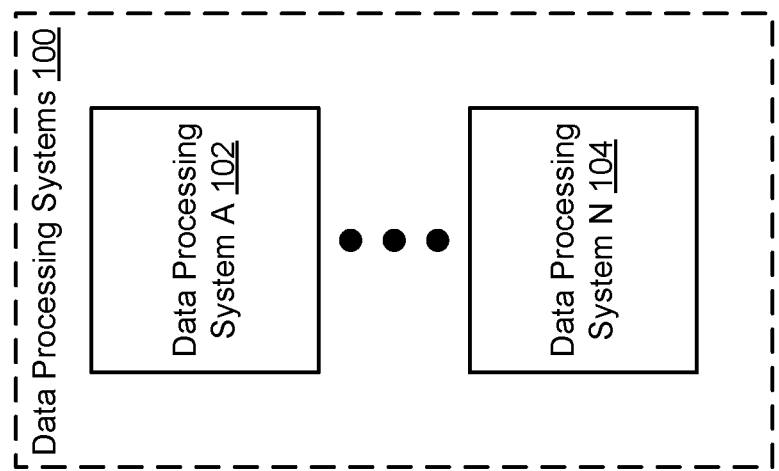
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices.

In general, embodiments disclosed herein relate to methods and systems for providing computer implemented services using data processing systems. To provide the computer implemented services, the data processing system may include hardware components that generate heat. The heat may need to be dissipated for continued operation of the hardware components.

To dissipate heat, the data processing system may include an enclosure that includes areas for fans and the hardware components. To improve the rate of cooling of the hardware components, the fans may be positioned adjacent to one another. Consequently, the density of the fans may be improved which may facilitate improved cooling rates.

To secure the fans in desired locations, the enclosure may include a fan retention mechanism. The fan retention mechanism may include a locking bar that applies pressure to the fans to hold them in the desired locations. To facilitate removal and insertion of fans, the fan retention mechanism may include guides (e.g., on either side of the locking bar) that may (i) reversibly secure the locking bar in a position, and (ii) when the locking bar is not secured in the position, limit a path along which the locking bar may traverse to facilitate automatic alignment of the fans and the locking bar. For example, the limited path may facilitate movement of the locking bar to predetermined positions that may (a) facilitate access to the fans, (ii) align the locking bar and fans, and (iii) facilitate compression of the locking bar and the fans into a predetermined area.

By doing so, embodiments disclosed herein may provide a data processing system capable of dissipating greater thermal loads while improving the likelihood of successful fan insertion and removal. Thus, embodiments disclosed herein may address the technical problems of heat generation in computing environments that may otherwise render the computing environments unable to perform desired computations. The disclosed embodiments may address these problems by providing a data processing system that facilitates higher rates of thermal dissipation and positioning/orienting of cooling devices such as fans.

In an embodiment, a data processing system that provides computer implemented services is provided. The data processing system may include a payload comprising hardware components that provides the computer implemented services; fans to cool the payload while the hardware components are providing the computer implemented services; an enclosure comprising: a payload area in which the payload is positioned, and a fan area in which the fans are positioned; and a fan retention mechanism attached to a portion of the enclosure in the fan area and adapted to: secure the fans against a wall of the enclosure via a translation of the fan retention mechanism along a first straight path from a first position and a second position with respect to the wall, and open the fan area for physical access via a rotation of the fan retention mechanism along a second path from the first position to a third position.

The fan retention mechanism may include a locking bar that applies force to the fans while the fans are secured against the wall, and a guide adapted to limit movement of the fan retention mechanism to the first straight path and the second path.

The enclosure may also include fixation elements positioned on the wall for reversible attachment of a portion of the fans, and the fixation elements aligning airflows generated by the portion of the fans with holes in the wall.

The fan area may include a portion of a base on which the fans as positioned while in the enclosure, the base comprising: keys having a shape that orients the portion of the fans positioned in the enclosure, the keys, during an insertion of a fan of the portion of the fans, preventing the fan from being seated unless oriented in a predetermined orientation.

Each of the fans may include a face; and an attachment receptacle on the face, the attachment receptacle having a shape that is complementary to a shape of one of the fixation elements.

The shape of the one of the fixation elements may limit motion of the fan that is parallel to a surface of the wall while the one of the fixation elements is positioned in the attachment receptacle.

The locking bar may include fixation elements on a side of the locking bar proximate to the wall, and the fixation elements aligning airflows generated by a portion of the fans with holes in the wall.

Each of the fans may include a face; and an attachment receptacle on the face, the attachment receptacle having a shape that is complementary to a shape of one of the fixation elements.

The shape of the one of the fixation elements may limit motion of the fan that is parallel to a surface of the wall while the one of the fixation elements is positioned in the attachment receptacle, and the locking bar limits orthogonal motion of the fan to the wall.

The guide may include a guide pin; a slot adapted to receive a joint; and a hole adapted for locking to a plunger.

The enclosure may also include a portion of a side wall in the fan area. The portion of the side wall may include a second slot adapted to receive the guide pin; the joint adapted to secure the guide to the side wall; and the plunger adapted to reversibly lock the hole in a position to prevent movement of the fan retention mechanism.

The second slot may include a straight portion and a curved portion, the straight portion defining the first straight path and the curved portion defining the second path.

In an embodiment, an enclosure and fans as noted above are provided.

Turning to FIG. 1A, a block diagram illustrating a system in accordance with an embodiment is shown. The system shown in FIG. 1A may provide any quantity and type of computer implemented services. To provide the computer implemented services, the system of FIG. 1A may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermine manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities such as data processing functionality, communication functionality, etc.

When providing their functionalities, any of the hardware components may consume electricity and generate heat. Any of the hardware components may have limitations on their operation. For example, any of the hardware components may have limitations regarding their temperatures (e.g., hardware components having such limitations being referred to as "temperature sensitive hardware components"). The temperature limitations may include an upper temperature limit. If temperatures of the temperature sensitive hardware components fall outside of the upper limit, then the corresponding temperature sensitive hardware components may be impaired (e.g., may not operate, may operate but in an undesirable manner such as including errors in their operation, may be subject to damage if operated, etc.).

In general, embodiments disclosed herein relate to systems, devices, and methods for improving the likelihood that data processing systems 100 are able to provide their computer implemented services. To improve the likelihood that data processing systems 100 are able to provide their computer implemented services, data processing systems 100 may include functionality to cool hardware components.

For example, data processing systems 100 may include fans. The fans may generate a flow of a gas (e.g., air or other ambient gasses, specific mixes of gases, gasses that have been process via heating/cooling/ventilation systems, etc.) which may be used to cool hardware components.

Figure 1B:
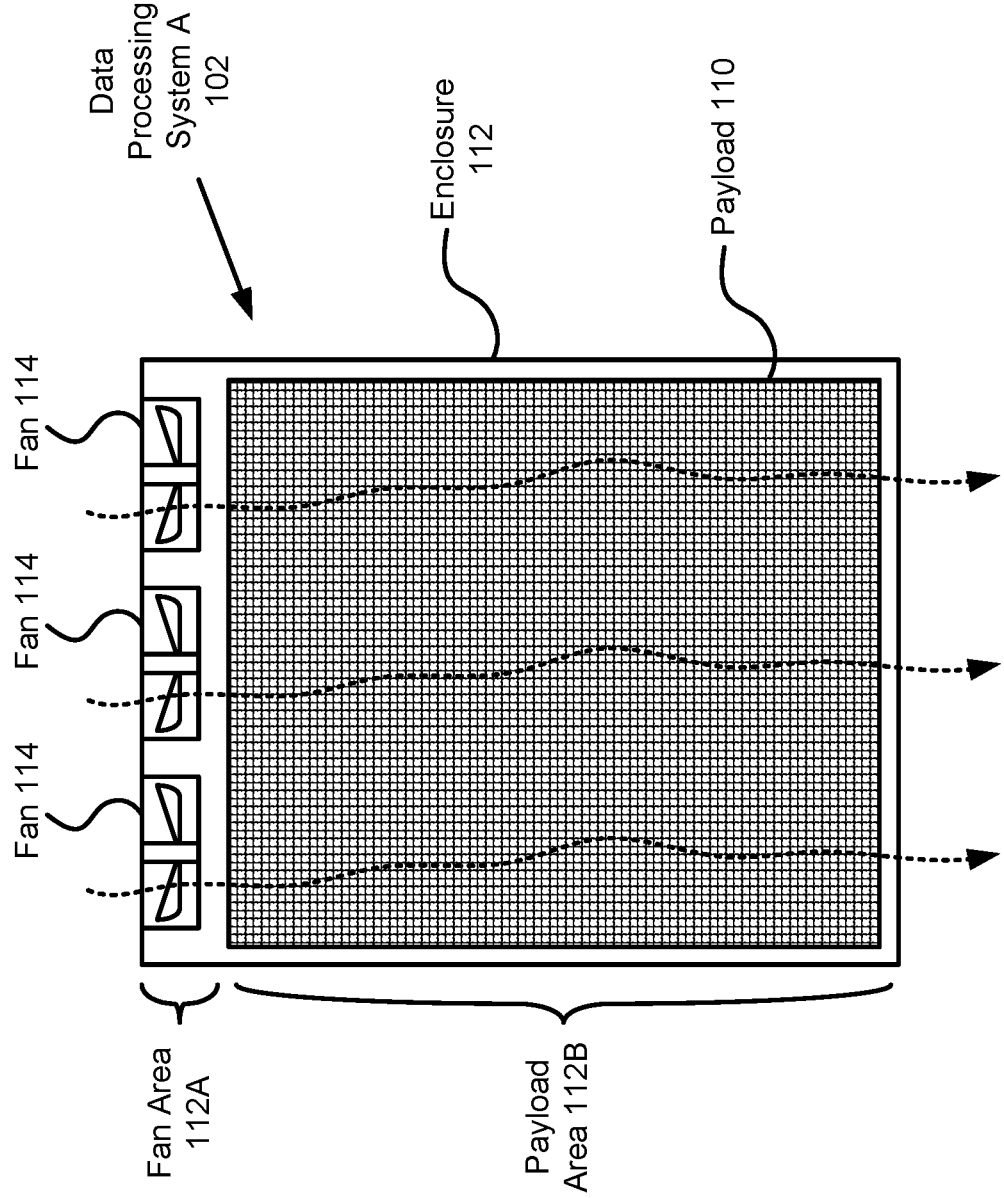
FIG. 1B shows a top view diagram illustrating gas flow in a data processing system in accordance with an embodiment.

To facilitate cooling of the hardware components, (i) the fans of the data processing system may be arranged in a specific manner (e.g., to improve fan density), (ii) an enclosure that may include features for orienting the fans and/or establishing placement of the fans, and (iii) a fan retention mechanism to prevent undesired movement of the fans. By doing so, embodiments disclosed herein may provide a data processing system that (i) has an improved ability to cool hardware components through enhanced gas flow rates and (ii) a lower likelihood of being impacted by operation of improperly retained fans (e.g., which may move, vibrate, be more susceptible to damage, etc.). Refer to FIG. 1B for additional details regarding flows of gas within data processing system usable for cooling, and FIGS. 1C-1M for additional details regarding components of data processing systems 100.

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 2.

The system of FIG. 1A may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1A.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1A as including a limited number of specific components, a system in accordance with an embodiment may include fewer, additional, and/or different components than those illustrated therein.

As noted above, the hardware component of data processing systems may generate heat that may need to be dissipated for the hardware components to continue to operate and provide desired computer implemented services. FIG. 1B shows an example of airflows (e.g., flows of any types/combinations of gasses) that may be used to dissipate heat from hardware components.

Turning to FIG. 1B, a top view diagram of data processing system A 102 in accordance with an embodiment is shown. Any of data processing systems 100 may be similar to data processing system A 102.

As seen in FIG. 1B, data processing system A 102 may include payload 110, enclosure 112, and any number of fans 114. Each of these components is discussed below.

Enclosure 112 may include a chassis usable to house other components of data processing system A 112. The chassis may be any type of chassis. For example, the chassis may be a rack mount chassis, a sled, and/or other type of structure for housing components of a data processing system.

Generally, enclosure 112 may be implemented with a physical structure including one or more areas in which payload 110, fans 114, and/or other components may be positioned. For example, enclosure 112 may include fan area 112A in which fans may be positioned and payload area 112B in which payload 110 may be positioned. Refer to FIGS. 1D-1M for additional details regarding enclosure 112

Payload 110 may include any number and types of hardware components. The hardware components may, at least in part, provide the computer implemented services provided by data processing system A 102. Any of the hardware components of payload 110 may be a temperature sensitive hardware component. Payload 110 may be positioned in payload area 112B.

To manage the temperatures of the temperature sensitive hardware components, any number of fans (e.g., 114) may be positioned in fan area 112A. Fans 114 may selectively generate a flow of gas (e.g., illustrated in FIG. 1B with wavy dashed lines terminating in arrows, top to bottom of the page). The flow of gas may flow proximate to payload 110 thereby facilitating thermal exchange which may cool any of the hardware components of payload 110. While not shown in FIG. 1B, data processing system A 102 may include other types of thermal management components (e.g., temperature sensors, controllers, manifolds, etc.) to orchestrate when and at what rate to generate the flow of the gas.

To facilitate increased rate of gas flow and improved computing resources density, fan area 112A may include a number of features that facilitate tight packing of fans and retention of the fans over time. The fans may substantially occupy all of the horizontal (e.g., across the page) and vertical space (e.g., into the page) to improve gas flow rates while also reducing use of space in which hardware components are not positioned (e.g., in comparison to scenarios in which various components may be positioned above/below/to the side of some of the fans, even components that may be used to retain the positions of fans 114). Refer to FIGS. 1D-3M for additional details regarding packing of fans in fan area 112A, and FIG. 1C for additional details regarding fan 114.

To further clarify aspects of data processing systems, FIGS. 1C-1M show diagrams of various features of a data processing system in accordance with an embodiment.

Figure 1C:
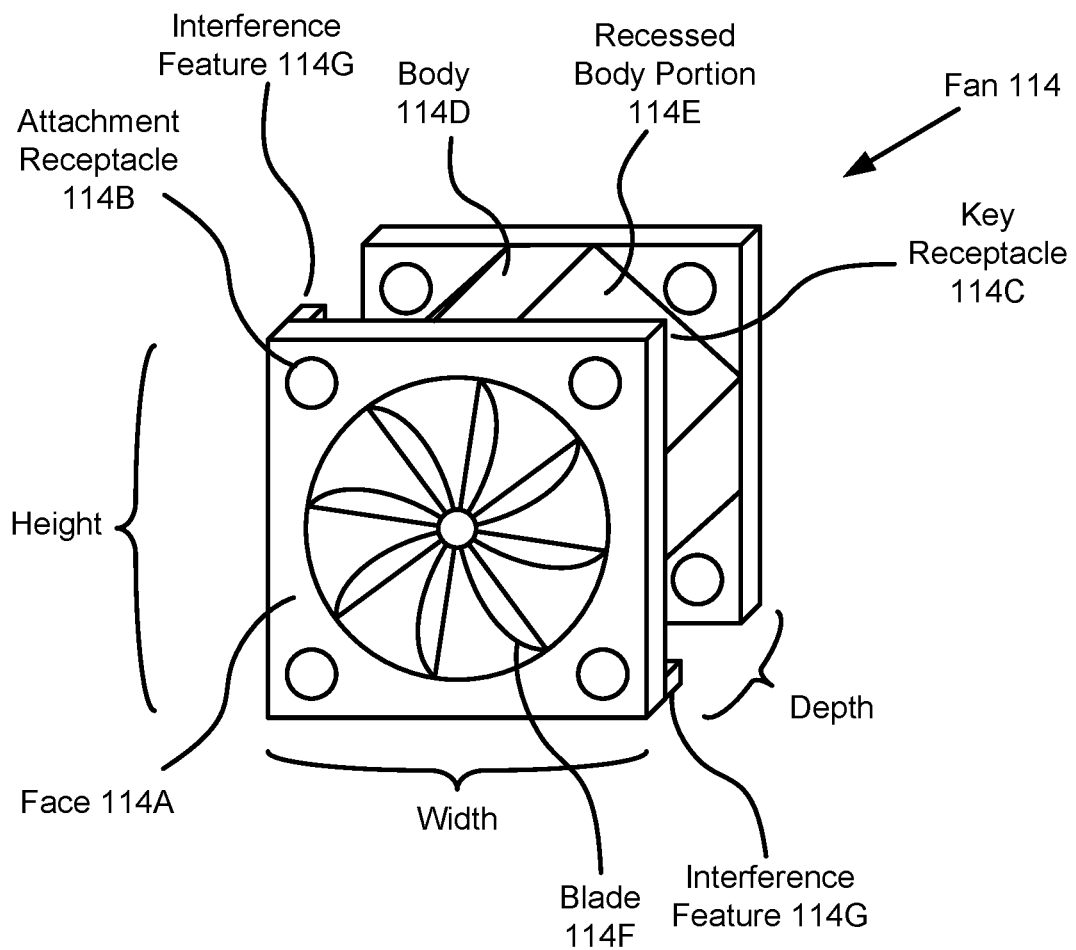
FIG. 1C shows a diagram of a fan in accordance with an embodiment.

Turning to FIG. 1C a diagram of fan 114 in accordance with an embodiment is shown. As noted above, fan 114 may selectively generate flows of gasses (e.g., when powered, which may be managed by a management component such as a thermal manager).

To do so, fan 114 may include any number of blades (e.g., 114F), a motor (not shown) coupled to the blades, a wiring harness (not shown) to obtain electrical power, etc. (e.g., in aggregate the "active components").

To orient and position fan 114 (e.g., to direct the gas flow), fan 114 may include body 114D in which the active components are positioned. Body 114D may be a physical structure (e.g., such as a plastic injection molded part), and may include faces (e.g., 114A) through which a flow of gas is generated. Attachment receptacles (e.g., 114B) may be positioned on the faces to facilitate reversible connection and alignment of body 114D with other structures. Attachment receptacles 114B may include, for example, holes through which bolts, connectors, pins, raised members, and/or other structures may be positioned.

To further facilitate alignment and connection with other components, body 114D may include any number of key receptacles (e.g., 114C). As seen in FIG. 1C, body 114D may be a substantially symmetrical structure which may lead to confusion regarding how it should be positioned with respect to other components. The key receptacles (e.g., 114C) may be implemented with mechanical features (e.g., to break the symmetry) that limit placement of fan 114 in various positions and orientations. For example, key receptacle 114C and interference features (e.g., 114G) may limit placement of fan 114 to certain orientations when complementary keys (refer to FIG. 1D for additional details) are present in the various locations where fan 114 may be positioned. For example, interference feature 114G may be a portion of body 114D that may prevent placement of fan 114 in certain positions and orientations by generating a mechanical interference with a key (e.g., 130) of an enclosure when fan 114 is not in a predetermined orientation. However, key receptacle 114C may not generate the mechanical interference while the key receptacle is positioned with the key (e.g., in contrast to when one of the interference features are positioned with the key). Generally, the keys of an enclosure may be repositionable to ensure that fans positioned in the enclosure are positioned to generate forward or reverse airflows, depending on how the enclosure operates within a computing environment.

While illustrated in FIG. 1C with key receptacle 114C being positioned on an outer surface of body 114D, it will be appreciated that key receptacles may be positioned elsewhere without departing from embodiments disclosed herein. For example, body 114D may include a recessed portion (e.g., 114E) on which a key receptacle may be positioned. The keys and key receptacles may be of any shape, size, and form.

While illustrated in FIG. 1C with a limited number of specific components in specific location and orientations, a fan may include additional, fewer, and/or different components in different positions/orientation than shown in FIG. 1C without departing from embodiments disclosed herein.

As seen in FIG. 1C, fan 114 may include various features (e.g., 114B, 114C) usable to position, orient, and/or reversibly attach fan 114 to other components. To manage positioning, orienting, and retention of fan 114, an enclosure may include complementary features to position, orient, and/or secure any number of fan 114 in a fan area.

Figure 1D:
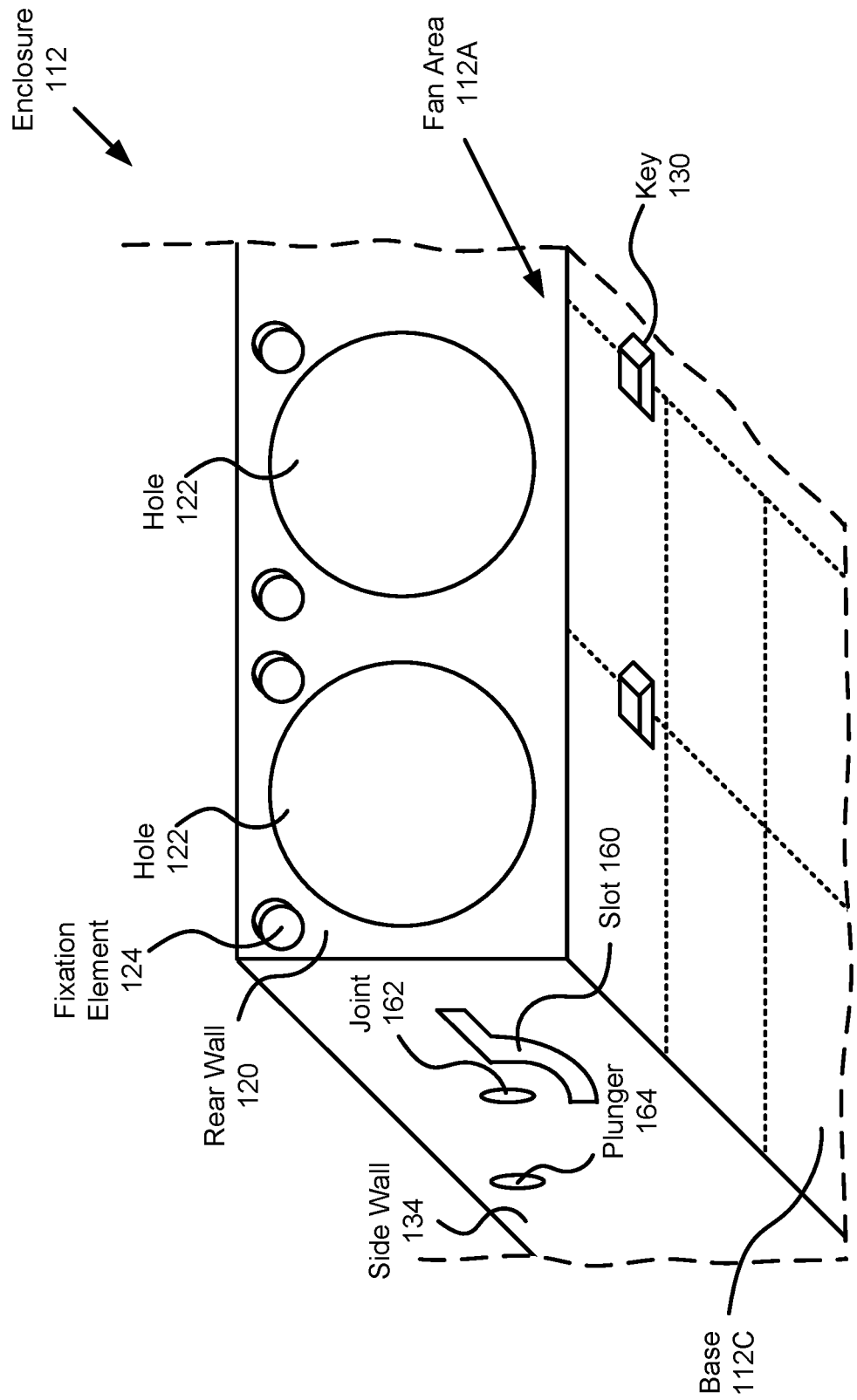
FIGS. 1D-1E show diagrams of an enclosure in accordance with an embodiment.

Turning to FIG. 1D, a diagram of a portion of enclosure 112 in accordance with an embodiment is shown. In FIG. 1D, the viewpoint is from above payload area 112B and looking downward into fan area 112A.

To position and retain fans in fan area 112A while allowing the fan to generate an airflow, fan area 112A may include rear wall 120. Rear wall 120 may be a rear portion of enclosure 112 and may include holes (e.g., 122) through which gasses may pass between the ambient environment and fan area 122A.

Rear wall 120 may also include fixation elements (e.g., 124). The fixation elements may have shapes complementary to the attachment receptacles (e.g., 114B) of fan 114. Likewise, some of the fixation elements may be positioned in a pattern complementary to a pattern of the attachment receptacles of fan 114. The fixation elements may be positioned so that when some of the fixation elements are positioned with attachment receptacles, then a flow of gas generated by fan 114 will be aligned with a hole (e.g., 122) in rear wall 120.

The fixation elements (e.g., 124) may be implemented with protrusions from a surface of rear wall 120. The protrusions may also include threaded holes (not shown) or other features to fixedly secure a fan to the fixation elements.

To position a fan with a hole, the fan may be positioned on a base (e.g., 112C) of enclosure 112. The attachment receptacles may be aligned with the fixation elements associated with the hole. Then, the fan may be moved toward rear wall 120 (e.g., until a face of the fan is up against it).

When so positioned, the fixation elements in the attachment receptacles may not allow the fan to move along the surface of rear wall 120. Rather, motion of the fan may be restricted to moving towards or away from rear wall 120 (e.g., due to interference of the fixation elements and the attachment receptacles).

To orient the fans prior to placement along rear wall 120, fan area 112A may also include key 130. Key 130 may be a physical structure positioned on base 112C that is complementary to a key receptacle of a fan. For example, key 130 may be a raised portion of base 112C that prevents a fan from being positioned on base 112C unless oriented in a predetermined manner. Key 130 may generally ensure that the direction of airflow generated by a fan is in an expected direction by ensuring that the fan is oriented in accordance with the expected airflow direction.

While illustrated in FIG. 1D as being a static element, keys (e.g., 130) may not be static. For example, the keys may be movable between different positions on base 112C. The positions may facilitate ensuring that fans are oriented in fan area 112A to either generate forward or reverse flows of gas.

Generally, fans positioned in fan area 112A may be arranged in two rows. A first row may be positioned on rear wall 120, as discussed above. The second row may be positioned on the other side of the first row. When so positioned, the two fans may be attached to one another via the attachment elements of each fan. For example, pins, bolts, and/or other attachment structures may be used to attach the two fans to one another.

Generally, the fans may be positioned across the width (e.g., left to right in FIG. 1D) of fan area 112A directly adjacent to one another. To further constrain mobility of the fans, enclosure may include side walls (e.g., 134) that may delineate the width of fan area 112A.

Figure 1E:
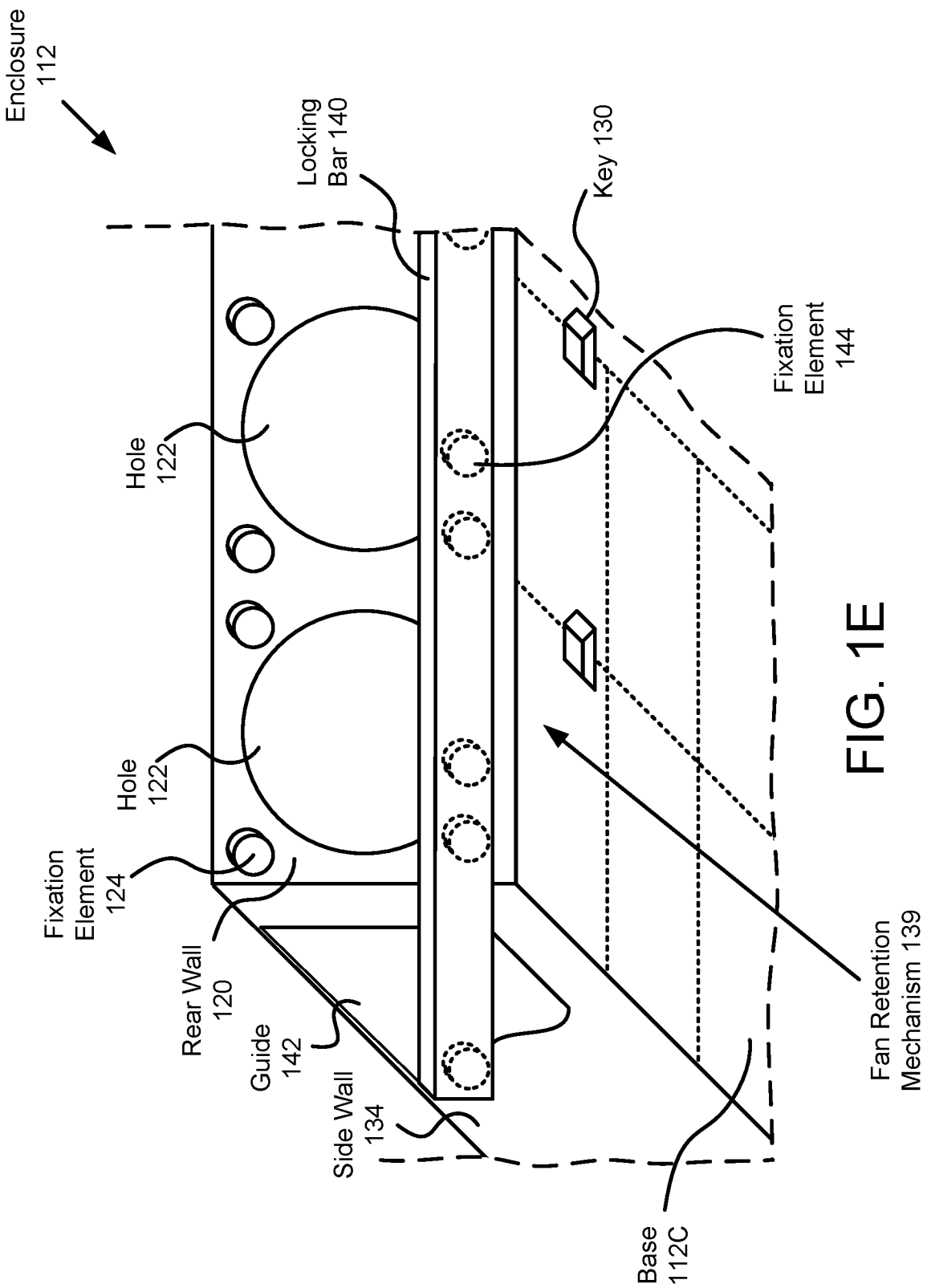

To retain the position and orientation of the two rows of fans, fan area 112A may also include a fan retention mechanism. The fan retention mechanism may reversibly secure the fans in place. Refer to FIG. 1E for additional details regarding the fan retention mechanism.

As part of the operation of the fan retention mechanism, the fan retention mechanism may be attached to and use various features of side wall 134. Side wall 134 may be an exterior portion of enclosure 112 (a similar, mirror sidewall may also be present to the right in FIG. 1D, for conciseness only a portion of enclosure 112 is shown with the wavy long dashed lines indicating that the structure may continue beyond these boundaries). Side wall 134 may include, for example, slot 160 (e.g., an opening in side wall 134), joint 162 (e.g., a rotational joint through which the fan retention mechanism may be connected to side wall 134), and plunger 164 (e.g., a mechanism which may reversibly fix in place the orientation and position of the retention mechanism, when not fixed in place the fan retention mechanism may have some degree of mobility limited by joint 162 and slot 160). Refer to FIGS. 1F-1L regarding these features.

Turning to FIG. 1E, a diagram of the portion of enclosure 112 and fan retention mechanism 139 in accordance with an embodiment is shown. In FIG. 1E, the viewpoint is from above payload area 112B and looking downward into fan area 112A. As noted above, fan retention mechanism may reversibly secure fans in fan area 112A. To provide its functionality, fan retention mechanism may include locking bar 140 and guide 142.

Locking bar 140 may apply force to fans to press them against rear wall 120. To do so, locking bar 140 may be movable between at least three position.

Figure 1F:
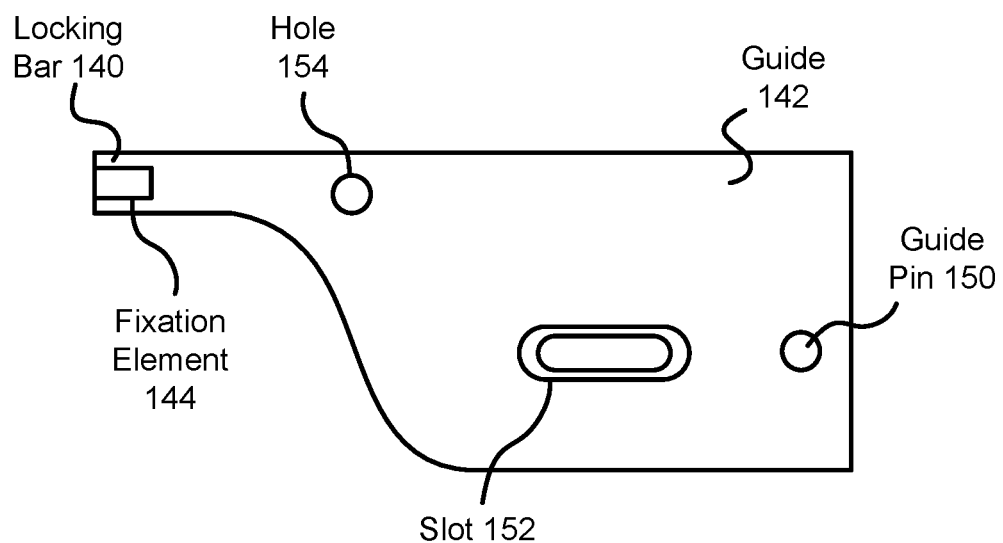
FIG. 1F shows a diagram of a guide of a fan retention mechanism in accordance with an embodiment.
Figure 1G:
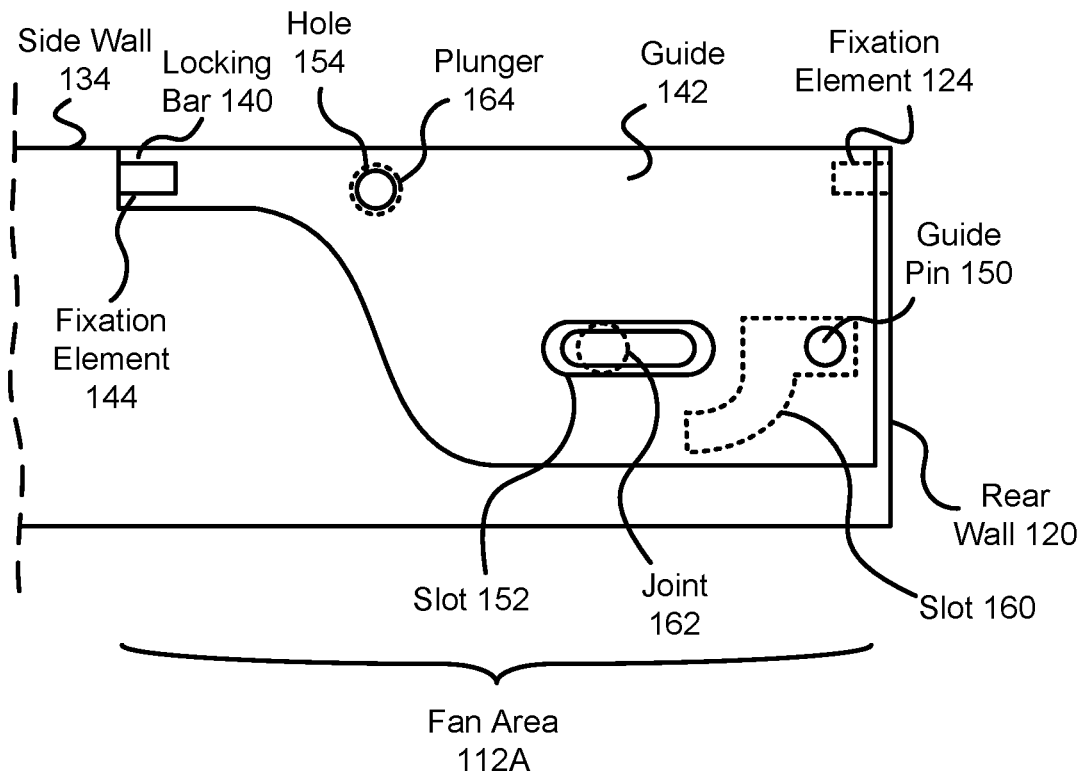
FIGS. 1G-1L show side view diagrams an enclosure of a data processing system in accordance with an embodiment.
Figure 1H:
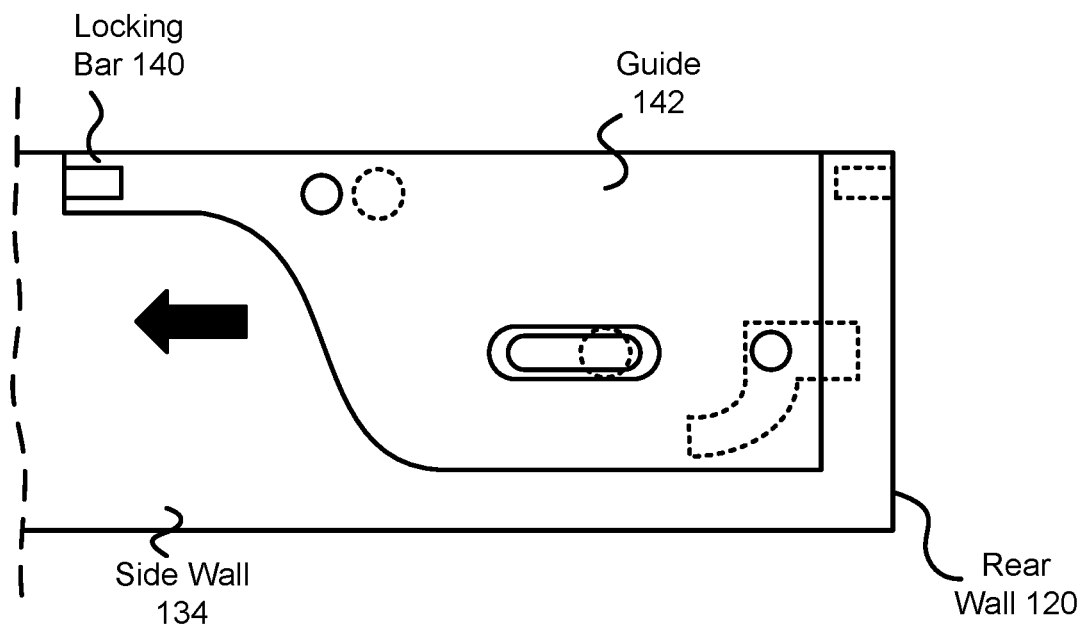
Figure 1I:
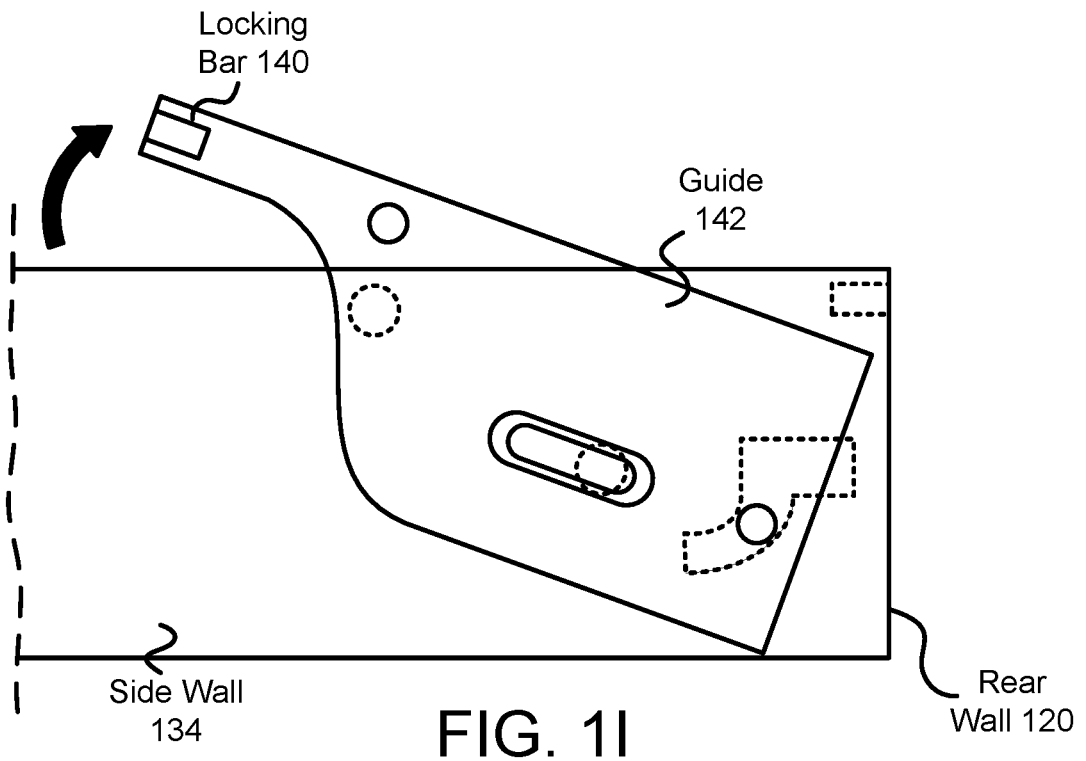
Figure 1J:
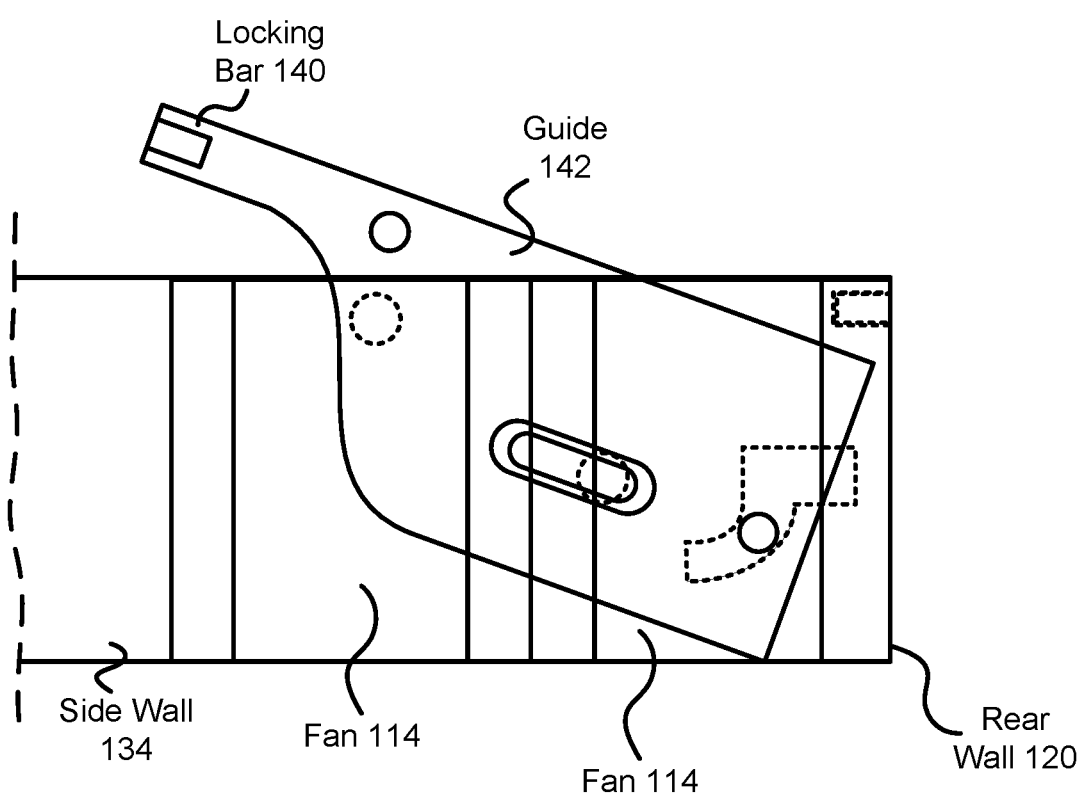
Figure 1K:
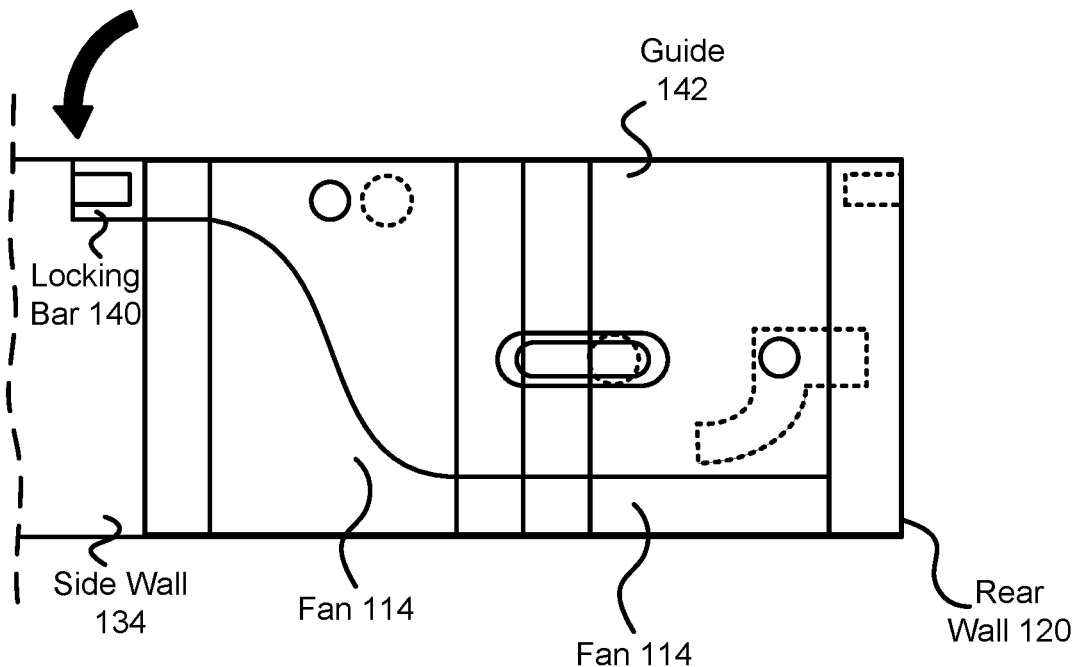
Figure 1L:
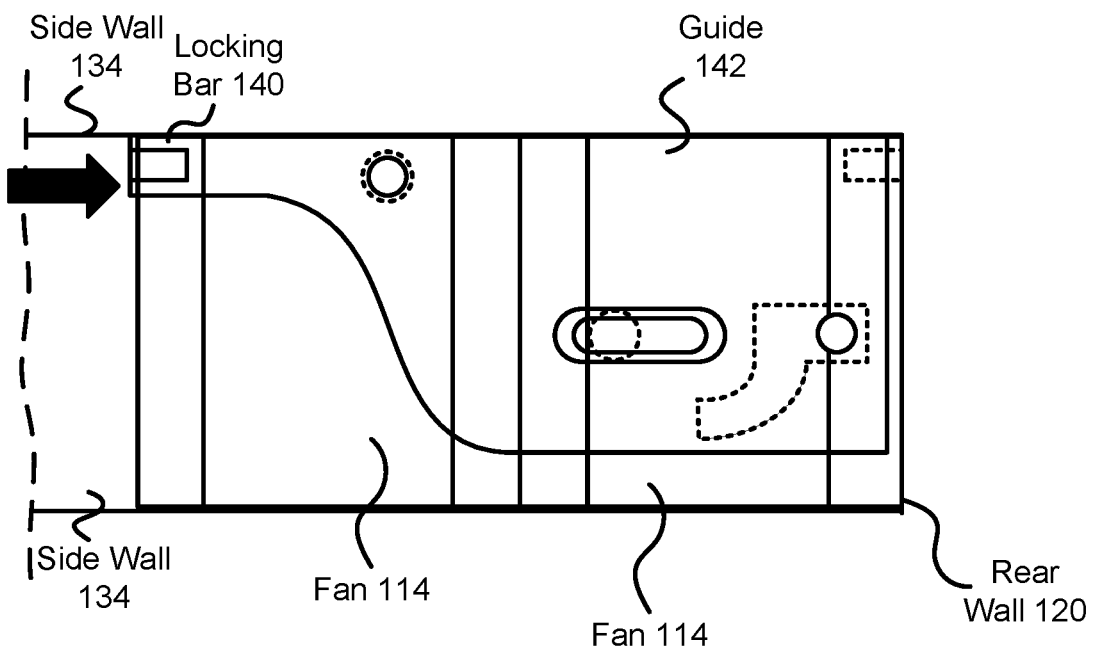

In a first position, locking bar 140 may be first distance away from rear wall 120. In this position, locking bar 140 may be in contact with some of the fans (e.g., the row immediately adjacent to it). Locking bar 140 may include fixation elements (e.g., 144 similar to those positioned on rear wall 120). The fixation elements of locking bar 140 and the fixation elements on rear wall 124 may be aligned with each other while locking bar is in the first position. Refer to FIGS. 1G and 1L for additional details regarding first position.

In a second position, locking bar 140 may be a second distance away from rear wall 120, but may otherwise be similarly oriented as described with respect to the first position. Generally, locking bar 140 may move along a straight path (e.g., translation) between first position and second position. When moved to the second position, the fixation elements (e.g., 144) positioned on locking bar 140 may be removed from the attachment receptacles of the fans, and the locking bar may no longer apply force to the fans. Consequently, the fans may be movable away from rear wall 120 there by allowing fixation elements (e.g., 124) on rear wall 120 to also be removed from the attachment receptacles of the fans. Accordingly, the fans may no longer be restricted from moving away from base 112C by the fixation elements, and the fans may be removed from fan area 112A and/or new fans maybe positioned in fan area 112A. Refer to FIGS. 1H and 1K for additional details regarding second position.

In a third position, locking bar may be rotated upward away from base 112C. Locking bar 140 may move along a curved path between the second position and the third position. While in the third position, the fans may be fully exposed and may be more easily added to or removed from fan area 112A. Refer to FIGS. 1I and 1J for additional details regarding third position.

Guide 142 may be a physical structure that may (i) attach locking bar 140 to side walls of enclosure 112, (ii) restrict movement of locking bar 140 to the positions and paths discussed above, and (iii) facilitate reversible securing of locking bar 140 in a particular location and orientation. Refer to FIG. 1F for additional details regarding guide 142.

Turning to FIG. 1F, a side view diagram of a fan retention mechanism showing guide 142 in accordance with an embodiment is shown. In FIG. 1F, the viewpoint is from the left or right hand side of the page of FIG. 1E looking toward an exterior surface of guide 142.

To provide its functionality, guide 142 may include guide pin 150, slot 152, and hole 154. Each of these components are discussed below.

Guide pin 150 may be implemented with a pin or other type of raised portion. Guide pin 150 may have a shape that facilitates movement along a slot (e.g., 160). Guide pin 150 may limit the ability of locking bar 140 to move between the three positions discussed above.

Slot 152 may be implemented with a slot in guide 142. Slot 152 may facilitate attachment of guide 142 to joint 162. For example, joint 162 may include a bold or other structure that may secure guide 142 to side wall 134, with the ability to translate and rotate within the limits imposed by slot 152 and the combination of guide pin 150 and slot 160.

Hole 154 may be implemented with a hole or other structure that allows insertion of a pin or other structure of plunger 164 through guide 142. When inserted, the pin or other structure may secure the position and orientation of the fan retention mechanism with respect to the rear wall of the enclosure. When removed, the fan retention mechanism may rotate and translate within the limits defined by slot 152, joint 162, guide pin 150, and slot 160.

While illustrated in FIG. 1F with a limited number of specific components, a guide may include additional, fewer, and/or different components without departing from embodiments disclosed herein.

To further clarify embodiments disclosed herein, FIGS. 1G-1L illustrate interactions between the fan retention mechanism and the features of an enclosure during insertion of securing of fans in the fan area of the enclosure. In these figures, a side view is presented with certain features of the enclosure drawn in dashing to facilitate their identification. In FIG. 1G, each of the features of interest of the fan retention mechanism and the enclosure are explicitly labeled. However, for clarity, in FIGS. 1H-1L many of these labels are removed to illustrate other aspects of the disclosed embodiments. It will be appreciated though that similar features are seen in both figures.

Turning to FIG. 1G, a first side view diagram of a data processing system in accordance with an embodiment is shown. In the first side view diagram, no fans are present in fan area 112A, and the fan retention mechanism is illustrated in a first position which may secure fans in fan area 112A.

As seen in FIG. 1G, guide pin 150 may be positioned within slot 160 (drawn with dashed outline), and joint 162 (drawn with dashed outline) may secure guide 142 to side wall 134 via slot 152. Additionally, plunger 164 (drawn with dashed outline) may be fixedly attached to hole 154 (e.g., a pin of plunger 164 may be inserted into the hole).

To enable positioning of fans in fan are 112A, plunger 164 may be actuated to detach it from hole 154. Once detached, force may be applied to the fan retention mechanism to move it away from rear wall 120. As seen in FIG. 1G, when in the first position, slot 160 may restrict guide pin 150 from moving in any direction other than away from rear wall 120. Likewise, joint 162 may also restrict (e.g., through interference with slot 152) motion of the fan retention mechanism other than toward or away from rear wall 120.

Turning to FIG. 1H, a second side view diagram of a data processing system in accordance with an embodiment is shown. The view may be the same as shown in FIG. 1G. Continuing the discussion from FIG. 1G, when force (e.g., illustrated by the oversized arrow) is applied to the fan retention mechanism directed away from rear wall 120, the fan retention mechanism may away from the rear wall until guide pin 150 reaches an end of a straight portion of slot 160 (e.g., as shown in FIG. 1H). The illustrated position in FIG. 1H may be the second position in which locking bar 140 (and the other portions of the fan retention mechanism) may be positioned.

In the second position, the distance between locking bar 140 and rear wall 120 may be sufficient that the fixation elements (e.g., 144, 124) may be removed from the attachment receptacles of the fans, thereby allowing the fans to be moved out of fan area 112A (e.g., upward in FIGS. 1G-1L).

Turning to FIG. 1I, a third side view diagram of a data processing system in accordance with an embodiment is shown. The view may be the same as shown in FIG. 1H. Continuing the discussion from FIG. 1I, once in the second position, force (e.g., illustrated by the oversized arrow) may be applied to the fan retention mechanism to rotate locking bar 140 (and the other portions of the fan retention mechanism) about joint 162. As seen in FIG. 1G, when in the second position, guide pin 150 may be positioned at the intersection of a straight section and a curved section of slot 160. Thus, when rotational force is applied, guide pin 150 may not restrict rotation of the fan retention mechanism about joint 162 (except to the extent that the curved portion of slot 160 may have a limited extent). Consequently, locking bar 140 may be rotated up and away from the fans thereby facilitating easier physical access to the fans and/or fan area 112A (e.g., for fan insertion purposes). While shown in FIG. 1I will a limited amount of rotation, it will be appreciated that the fan retention mechanism may rotate to any extent (e.g., 90°, 135°, etc.) about joint 162 when moving from the second to the third position (e.g., the third position may be similar to that shown in FIG. 1I).

Turning to FIG. 1J, a fourth side view diagram of a data processing system in accordance with an embodiment is shown. The view may be the same as shown in FIG. 1I. Continuing the discussion from FIG. 1J, fans (e.g., 114) may be positioned in fan area 112A while the fan retention mechanism is in the third position (e.g., which may facilitate insertion through easier physical access to fan area 112A. While not shown in FIGS. 1G-1L, keys may prompt appropriate insertion direction and/or orientation of the fans.

Turning to FIG. 1K, a fifth side view diagram of a data processing system in accordance with an embodiment is shown. The view may be the same as shown in FIG. 1J. Continuing the discussion from FIG. 1K, after the fans (e.g., 114) are positioned, force (shown with the filled oversized arrow) may be applied to the fan retention mechanism to rotate it back to the second position. When in the second position, the fixation elements of locking bar 140 and rear wall 120 may be aligned with the attachment receptacles of the fans.

Turning to FIG. 1L, a sixth side view diagram of a data processing system in accordance with an embodiment is shown. The view may be the same as shown in FIG. 1K. Continuing the discussion from FIG. 1L, force (shown with the filled oversized arrow) may be applied to the fan retention mechanism to translate it from the second position to the first position. Doing so may press locking bar 140 against the fans (e.g., 114), insert the fixation elements into the attachment receptacles of the fan, and may cause the plunger 164 to attach (e.g., insert a pin) to hole 154. Consequently, the fans may be held fixedly in place and may be restricted from moving. Additionally, the attachment between plunger 164 and hole 154 may prevent the fan retention mechanism from moving. Accordingly, the fans may be secured in place until the fan retention mechanism is moved (e.g., by a person that may pull plunger 164 to detach it from hole 154, thereby facilitating movement of the fan retention mechanism).

Figure 1M:
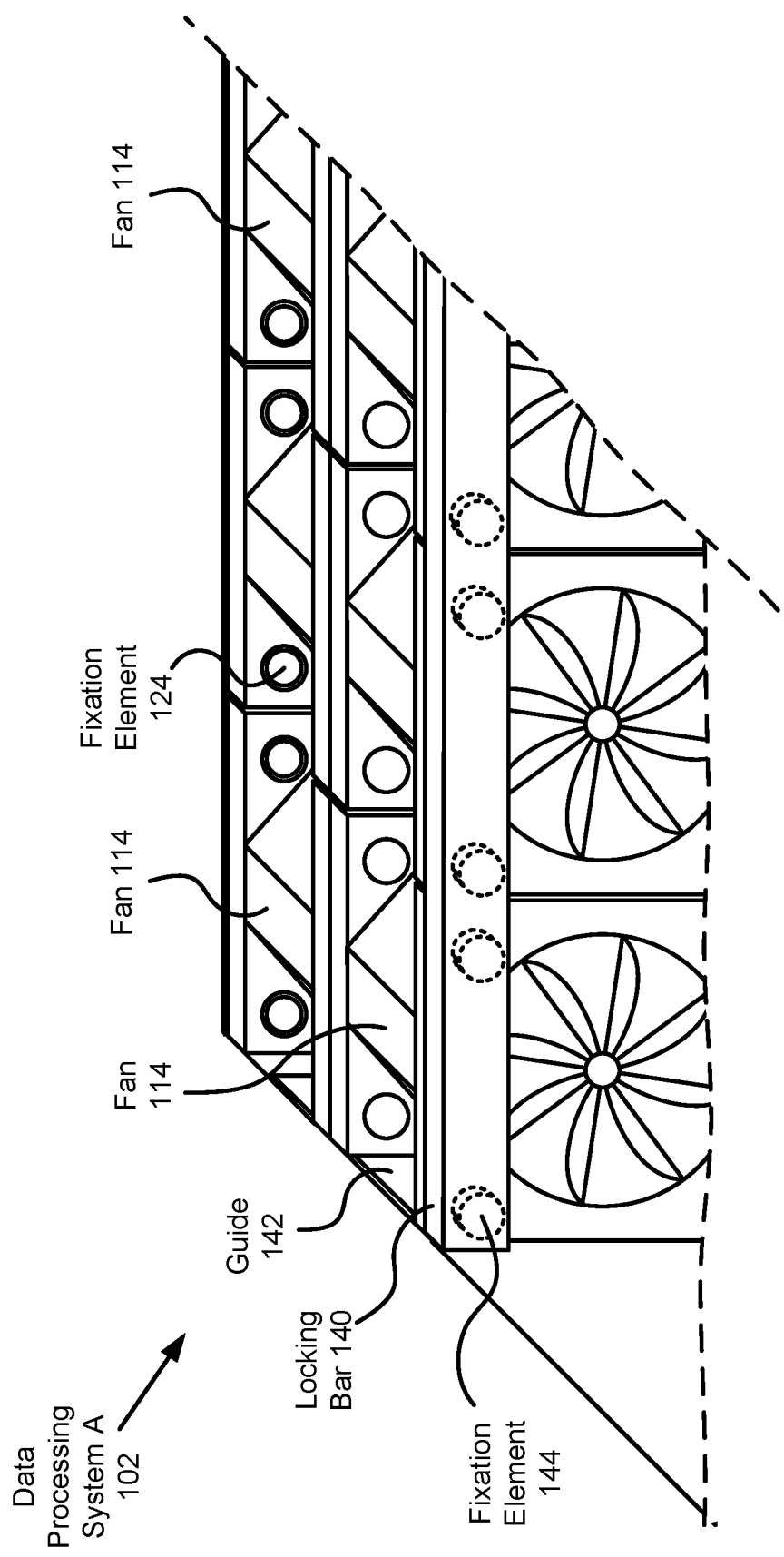
FIG. 1M shows a diagram of an enclosure of a data processing system in accordance with an embodiment.

Turning to FIG. 1M, a diagram of data processing system A 102 in accordance with an embodiment is shown. The view may be similar to that illustrated in FIG. 1E, however, fans (e.g., 114) may now be positioned in fan area 112A. As seen in FIG. 1M, locking bar 140, fixation elements (e.g., 144) positioned thereon, and other fixation elements (e.g., 124) positioned on a rear wall of an enclosure may secure the fans in place as shown.

As discussed with respect to FIG. 1A, data processing systems 100 may be implemented with a computing device. For example, the payload positioned in a payload area of an enclosure of a data processing system may include a computing device. The computing device may provide computer implemented services to users of the data processing system and/or other devices operably connected to the data processing system.

Figure 2:
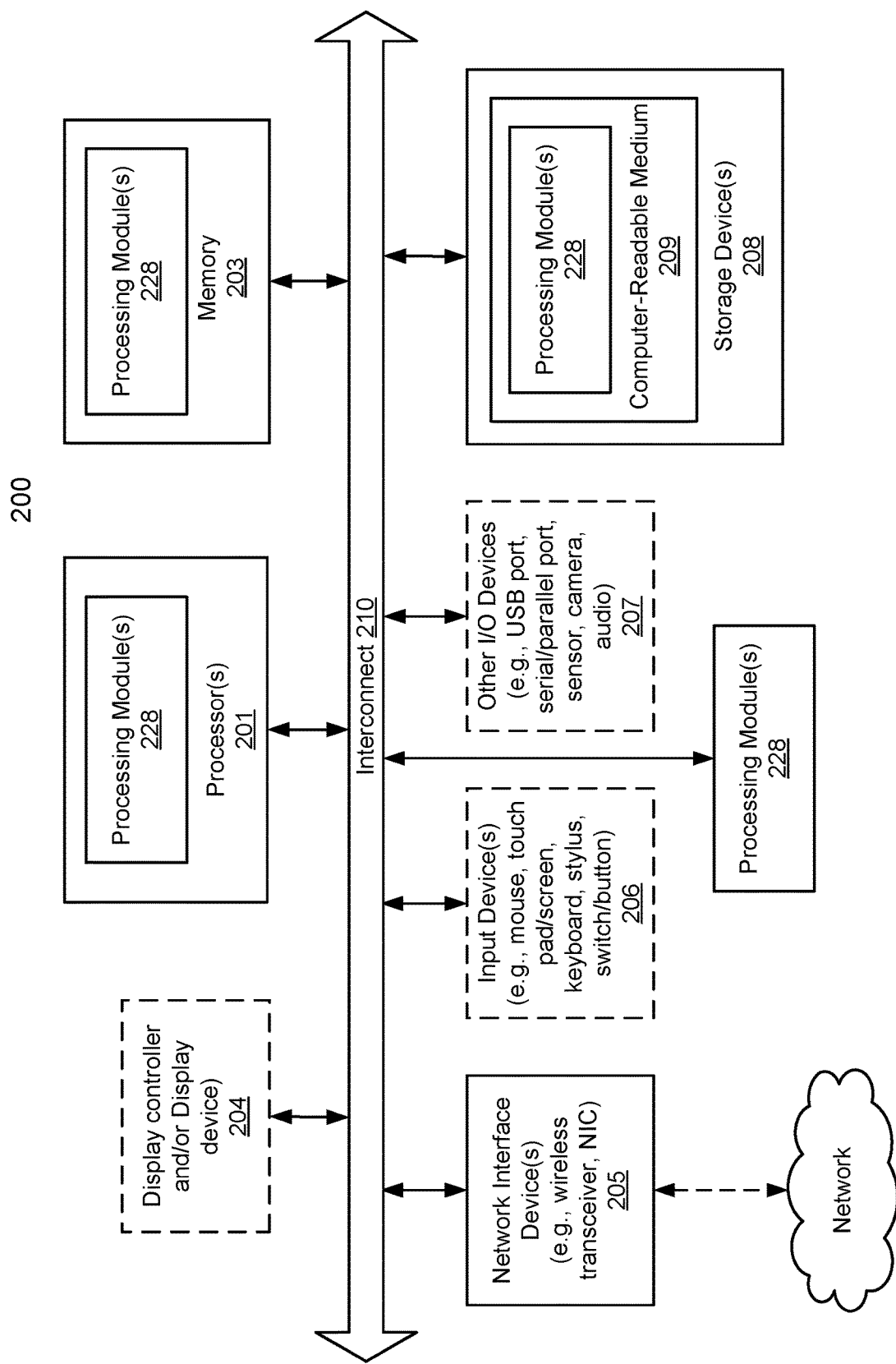
FIG. 2 shows a block diagram illustrating a computing device in accordance with an embodiment.

Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components.

These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-208 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
    a payload comprising hardware components that provides the computer implemented services;
    fans to cool the payload while the hardware components are providing the computer implemented services;
    an enclosure comprising:
        a wall with holes,
        a payload area in which the payload is positioned,
        a fan area in which the fans are positioned, and
        fixation elements positioned on the wall for reversible attachment of a portion of the fans, the fixation elements aligning airflows generated by the portion of the fans with the holes in the wall; and
    a fan retention mechanism attached to a portion of the enclosure in the fan area and adapted to:
        secure the fans to the wall of the enclosure via a translation of the fan retention mechanism along a first straight path from a first position to a second position, and
        open the fan area for physical access via a rotation of the fan retention mechanism along a second path from the first position to a third position.

2. The data processing system of claim 1, wherein the fan retention mechanism comprises, at least:
    a locking bar that applies force to the fans while the fans are secured against the wall.

3. The data processing system of claim 2, wherein the locking bar comprises:
    the fixation elements on a side of the locking bar proximate to the wall.

4. The data processing system of claim 3, wherein each of the fans comprises:
    a face; and
    an attachment receptacle on the face, the attachment receptacle having a shape that is complementary to a shape of one of the fixation elements.

5. The data processing system of claim 4, wherein the shape of the one of the fixation elements limits motion of a fan of the fans that is parallel to a surface of the wall while the one of the fixation elements is positioned in the attachment receptacle, and the locking bar limits orthogonal motion of the fans to the wall.

6. The data processing system of claim 1, wherein the fan area comprises:
    a portion of a base on which the fans as positioned while in the enclosure, the base comprising:
        keys having a shape that orients the portion of the fans positioned in the enclosure, the keys, during an insertion of a fan of the portion of the fans, preventing the fan from being seated unless oriented in a predetermined orientation.

7. The data processing system of claim 6, wherein each of the fans comprises:
    a face; and
    an attachment receptacle on the face, the attachment receptacle having a shape that is complementary to a shape of one of the fixation elements.

8. The data processing system of claim 7, wherein the shape of the one of the fixation elements limits motion of the fan that is parallel to a surface of the wall while the one of the fixation elements is positioned in the attachment receptacle.

9. The data processing system of claim 1, wherein the fan retention mechanism comprises, at least:
    a guide adapted to limit movement of the fan retention mechanism to the first straight path and the second path, wherein the guide comprises:
        a guide pin;
        a slot adapted to receive a joint; and
        a hole adapted for locking to a plunger.

10. The data processing system of claim 9, wherein the enclosure further comprises:
    a portion of a side wall in the fan area, the portion of the side wall comprising:
        a second slot adapted to receive the guide pin;
        the joint adapted to secure the guide to the side wall; and
        the plunger adapted to reversibly lock the hole in a position to prevent movement of the fan retention mechanism.

11. The data processing system of claim 10, wherein the second slot comprises:
    a straight portion and a curved portion, the straight portion defining the first straight path and the curved portion defining the second path.

12. An enclosure for a data processing system, the enclosure comprising:
    fans to cool a payload;
    a wall with holes;

a payload area adapted to house a payload of hardware components for providing computer implemented services;

a fan area in which the fans are positioned;

fixation elements positioned on the wall for reversible attachment of a portion of the fans, the fixation elements aligning airflows generated by the portion of the fans with the holes in the wall;

a portion of a sidewall in the fan area; and a fan retention mechanism attached to the portion of the sidewall, the fan retention mechanism adapted to:

secure the fans to the wall of the enclosure via a translation of the fan retention mechanism along a first straight path from a first position to a second position, and open the fan area for physical access via a rotation of the fan retention mechanism along a second path from the first position to a third position.

13. The enclosure of claim 12, wherein the fan retention mechanism comprises:

a locking bar that applies force to the fans while the fans are secured against the wall.

14. The enclosure of claim 13, wherein the locking bar comprises:

the fixation elements on a side of the locking bar proximate to the wall.

15. The enclosure of claim 14, wherein each of the fans comprises:

a face; and an attachment receptacle on the face, the attachment receptacle having a shape that is complementary to a shape of one of the fixation elements.

16. The enclosure of claim 13, wherein the fan retention mechanism further comprises:

a guide adapted to limit movement of the fan retention mechanism to the first straight path and the second path.

17. The enclosure of claim 16, wherein the guide comprises:

a guide pin;

a slot adapted to receive a joint; and a hole adapted for locking to a plunger.

18. The enclosure of claim 12, wherein the fan area comprises:

a portion of a base on which the fans as positioned while in the enclosure, the base comprising:

keys having a shape that orients the portion of the fans positioned in the enclosure, the keys, during an insertion of a fan of the portion of the fans, preventing the fan from being seated unless oriented in a predetermined orientation.

19. The enclosure of claim 18, wherein each of the fans comprises:

a face; and an attachment receptacle on the face, the attachment receptacle having a shape that is complementary to a shape of one of the fixation elements.

20. The enclosure of claim 19, wherein the shape of the one of the fixation elements limits motion of the fan that is parallel to a surface of the wall while the one of the fixation elements is positioned in the attachment receptacle.

* * * * *